United States Patent [19]

Sadoway et al.

[11] Patent Number: 4,911,800
[45] Date of Patent: Mar. 27, 1990

[54] ELECTROCHEMICALLY CONTROLLED SUPERCONDUCTIVITY

[75] Inventors: Donald R. Sadoway, Belmont; Robert M. Rose, Wenham, both of Mass.

[73] Assignee: Massachusetts Institute of Technology, Cambridge, Mass.

[21] Appl. No.: 179,047

[22] Filed: Apr. 8, 1988

[51] Int. Cl.[4] ............... C25B 1/00; G01R 33/00; G02F 1/01
[52] U.S. Cl. ................... 204/56.1; 204/58.5; 324/260; 350/355
[58] Field of Search ............... 204/56.1; 324/260; 350/355

[56] References Cited

U.S. PATENT DOCUMENTS 4,517,253  5/1985  Rose et al. ............... 428/620

OTHER PUBLICATIONS

Rosamilia et al., J. Electrochem. Soc., Jul. 1987, pp. 1863–1864.
O'Sullivan et al., Materials Research Soc. Meeting, Nov. 30–Dec. 5, 1987, Boston, Mass., Pater AA 4.75.

*Primary Examiner*—T. M. Tufariello
*Attorney, Agent, or Firm*—Fish & Richardson

[57] ABSTRACT

The superconducting properties of superconducting compounds are controlled or maintained by active external electrochemical intervention. The superconducting compound forms one electrode in an electrochemical cell. A counterelectrode and the superconducting compound electrode are in contact with an electrolyte and a potential is applied between the counterelectrode and the superconducting electrode. The cell is operated at a temperature near the expected transition temperature of the superconducting material. The potential applied between the electrodes is selected to control a property such as transition temperature. In a preferred embodiment, a superconducting material such as $Ba_2YCu_3O_{7-x}$ serves as an anode and a counterelectrode such as a mercury-mercuric oxide reference electrode serves as a cathode. Suitable oxygen-bearing electrolytes are ozone and trifluoronitrosomethane. In another embodiment, a superconducting cuprate material serves as a cathode and the electrolyte is copper-bearing.

27 Claims, 3 Drawing Sheets

ELECTROCHEMICALLY CONTROLLED SUPERCONDUCTIVITY

BACKGROUND OF THE INVENTION

This invention relates to electrochemical cells for controlling the properties of superconducting materials.

Ceramic oxide superconducting materials are known having critical or transition temperatures of approximately 90° K. An example is $Ba_2YCu_3O_{7-x}$. The origins of superconductivity in these copper-containing oxides with perovskite-related structures are not presently well understood. The reported irreproducibility of superconducting properties and the evanescence of high temperature superconductivity reported at temperatures as high as 500° C. indicate that these materials are, at least in some respects, unstable or metastable with regard either to the phase or to the type of defects that are required for high temperature superconductivity. There is speculation that controlling the effective valence of copper ions in the material is important for maintaining the superconducting state. Empirical observations that the critical temperature for the onset of superconductivity, designated $T_c$, depends upon the processing history of the sample, in particular, on the oxygen potential of the atmosphere in which the sample was prepared supports this speculation. It is known that in certain classes of oxide materials the valency of cations such as copper can be altered by variation of the chemical potential of oxygen.

The chemical potential of oxygen, or oxygen potential, can be controlled by equilibrating a solid sample with a gas phase of fixed composition during processing. This process is termed chemical control of the oxygen potential in the solid crystal. It is also known to establish the oxygen potential during processing of superconducting materials electrochemically by contacting the solid sample with a suitable electrolyte and setting the electrical potential of the sample with respect to a counterelectrode also in contact with the same electrolyte. Both of these known processes establish oxygen potential only during processing at temperatures much higher than the critical temperatures. Thereafter (at low temperatures) the material was left to interact with its service environment. Consequently, deviation in stoichiometry, phase instability, or instability of crystal defects such as oxygen vacancy arrays which are conducive to high temperature superconductivity is possible. A suboptimal composition would result and transition temperature would suffer. Thus, because these materials appear to be unstable or metastable, the best superconducting properties themselves may be lost since the prior art contemplated no way for actively controlling oxygen potential or cation valency during superconducting operation. Other superconducting materials with lower transition temperatures are also known. An example is a refractory metal nitride such as niobium nitride.

SUMMARY OF THE INVENTION

The electrochemistry of a superconducting compound material such as a cuprate or nitride at the superconducting operating temperature is actively controlled so as to stabilize or modulate superconducting properties of the material such as the transition or critical temperature. The electrochemistry is controlled by operating the superconducting material in an electrochemical cell. The cell includes a counterelectrode and an electrolyte contacting both the superconducting material and the counterelectrode. A potential is applied between the superconducting material and the counterelectrode to control or maintain a desired property. In a preferred embodiment, the effective valency of the copper ion in a superconducting oxide material is controlled indirectly by polarizing the material anodically in order to set the chemical potential of oxygen which in turn affects the copper valency.

In this embodiment, the superconducting material serves as the anode and the electrolyte is an oxygen-bearing medium in which the dominant mode of electrical conductivity is ionic. It is preferred but not necessary that the electrolyte be liquid at the critical temperature of the superconducting material. Suitable electrolytes are preferably oxygen ion conductors which may include $O_3$ and $CF_3NO$. The counterelectrode may be an inert metallic conductor such as gold or platinum which is an example of an ideal polarizable electrode. Alternatively, one may use an oxygen reference electrode such as an inert metallic conductor over which pure oxygen gas is bubbled. The potential between the superconducting material and the counterelectrode is provided by connecting the electrodes to a power supply such as, for example, a potentiostat. The superconducting material is charged positively with respect to the counterelectrode, and a DC voltage is maintained between the two. A suitable voltage for establishing a desired critical temperature is determined empirically. When an oxygen reference electrode serves as the counterelectrode, the magnitude of the voltage to achieve a desired property may be determined by the Nernst equation.

In another embodiment of the invention, the chemical potential of copper in a cuprate superconducting material is established directly by polarizing the cuprate material cathodically. In this embodiment, the superconducting oxide material and a counterelectrode are in contact with a copper-bearing electrolyte. A suitable electrolyte for this embodiment would provide an ionic dissolved form of copper. Such a solution may include $CF_3NO$ in which a copper salt has been dissolved.

In another embodiment of the invention, a refractory metal nitride such as niobium nitride serves as an anode in an electrochemical cell. A nitrogen bearing electrolyte based upon liquid cyanogen, $(CN)_2$, for example, contacts the niobium nitride anode and a counterelectrode. As with the embodiments discussed above, the potential between the superconducting material and the counterelectrode is controlled as by a potentiostat. By controlling the potential between the superconducting material and the counterelectrode, the superconducting properties of the refractory metal nitride may be controlled.

In the foregoing embodiments of the invention, that is, the anodically polarized superconductor and the cathodically polarized superconductor, the chemistry within the superconductor is varied by changing the electrical potential of that material with respect to a counterelectrode in an electrochemical cell where both the superconductor and the counterelectrode are in contact with the same electrolyte, at temperatures at which the superconductor is in the superconducting state. As long as the potential is applied, the properties of the superconductor are controlled; that is to say, active intervention by electrochemical means controls or changes the behavior of a material, while the material is in service. As discussed above, whereas prior fabrication methods could establish oxygen potential of the oxide superconductors only during processing at higher temperatures, the present invention can, by using unique electrolytes in an electrochemical cell, control the electrochemistry of the system at the service temperature and therefore actively stabilize or modulate superconducting properties. The modulating capability may be applied in the form of devices, such as a tunable infrared detector, in which the energy gap of one electrode in a Josephson junction is controlled electrochemically, or in a transistor or switch based on an electrochemically induced transition from the superconducting to the normal states, or in any Josephson device, as the effect can be electrochemically modulated, e.g., mixers, detectors and modulators. The invention will also have application for devices for measuring magnetic fields, for thin film microelectronic devices, and for magnetic anomaly detectors.

DESCRIPTION OF THE PREFERRED EMBODIMENTS

Figure 1:
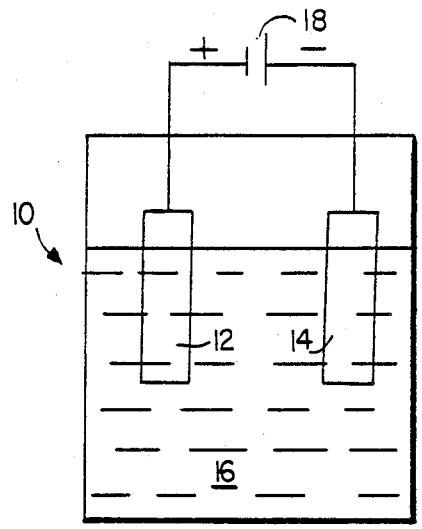
FIGS. 1 and 2 are schematic illustrations of the electrochemical cells disclosed herein.

With reference to FIG. 1, an electrochemical cell 10 according to the invention includes an anode 12 which is one of the superconducting copper containing oxides with a perovskite-related crystal structure such as yttrium barium cuprate, $Ba_2YCu_3O_{7-x}$. It will be appreciated by those skilled in the art that the present invention applies to all members of the recently discovered class of high temperature ceramic oxide superconductors. For example, other elements such as bismuth, strontium, calcium, aluminum and many of the rare earth elements may be substituted for the yttrium and the barium. A counterelectrode 14 may be an ideal polarizable electrode made of an inert metallic conductor such as gold or platinum. Alternatively, the electrode 14 may be a reference electrode based upon an equilibrium involving oxygen which would establish a reference voltage through such a reaction. For example, at temperatures above the normal boiling point of oxygen one can bubble oxygen gas over a solid substrate such as platinized platinum in order to conduct such a reaction. When the counterelectrode is such a reference electrode, the electrochemical cell 10 can be termed a concentration cell. When the electrode 14 is an ideal polarizable electrode, the electrode does not react chemically or electrochemically with the electrolyte, but simply functions as a current lead; in other words, there is no electrochemical reaction occurring on this electrode, and thus at any applied voltage, it draws zero current.

An important aspect of the present invention is an electrolyte 16 which contacts both the anode 12 and cathode 14. The electrolyte 16 may be a solid or a liquid. However, at the low temperatures of operation presently required of cuprate-based superconducting oxides, a liquid electrolyte is preferred. Such an electrolyte must thus remain liquid at the operating temperature of the cell 10 which is near the critical temperature, $T_c$, of the superconducting material. The electrolyte 16 must be an oxygen-bearing medium in which the dominant mode of electrical conductivity is ionic. The potential window, that is to say the range of voltage to which the electrolyte can be subjected, must be such that it does not decompose under the conditions of operation of the cell 10. Furthermore, the electrolyte 16 should prevent the dissolution of the cationic constituents of the oxide material in the electrode 12, so that at any set voltage the reaction on the electrode 12 is oxygen evolution. Aqueous electrolytes cannot be used for this purpose for two reasons. The potential window is too narrow, and cuprate-based oxides are chemically attacked by, that is to say react with, water. Because yttrium barium cuprate has a critical temperature around 90° K., the electrolyte 16 must remain liquid at this temperature. It is contemplated that the electrolyte 16 will be a multicomponent solution. In this case, it is not necessary that each and every constituent of such a multicomponent electrolyte satisfy the selection criteria. Two examples of liquids that form the basis of a satisfactory electrolyte are ozone, chemical formula $O_3$, and trifluoronitrosomethane, chemical formula $CF_3NO$.

The superconducting cuprate anode 12 and counterelectrode 14 are connected to a power supply such as, for example, a potentiostat 18 which applies an electrical potential between the superconductor electrode 12 and the counterelectrode 14. The superconductor electrode 12 is charged positive with respect to the counterelectrode 14, and an adjustable DC voltage is maintained between the two. The oxygen potential in the cuprate superconducting electrode 12 is set by the potential of the potentiostat 18. As discussed above, the oxygen potential indirectly controls the copper valency in the cuprate material and this in turn controls properties of the superconducting material such as its critical temperature. When the counterelectrode 14 is an ideal polarizable electrode, the relationship between potential established between the electrodes and, for example, critical temperature, is determined empirically. In the case in which an oxygen reference electrode is serving as the counterelectrode 14, the relationship between voltage and oxygen potential is given by the Nernst equation.

It is important to recognize that the potential between the electrodes is maintained throughout the service operation of the superconducting material 12 in its superconducting state. The potential between the electrodes is used to establish, stabilize, induce, or modulate superconductivity. For example, by altering the voltage of the potentiostat 18, one can select a desired critical temperature. Stated differently, the present invention allows one to set the energy gap of the superconducting oxide material.

Figure 2:
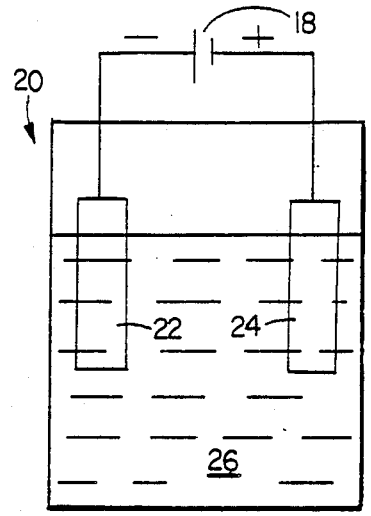

Another embodiment of the invention is shown in FIG. 2. An electrochemical cell 20 controls the valency of copper in a cuprate crystal directly by cathodic polarization rather than indirectly by polarizing the crystal anodically as described in conjunction with FIG. 1.

In FIG. 2, a superconducting oxide material 22 and a counterelectrode 24 are immersed within an electrolyte 26. In this cell, the superconducting oxide electrode 22 is charged negative with respect to the counterelectrode 24 by a potentiostat 18. In this embodiment, the electrolyte 26 is a copper-bearing electrolyte. Such an electrolyte must be chemically and electrochemically stable over the range of applied potential. A suitable electrolyte would provide an ionic dissolved form of copper and may be a multicomponent solution of $CF_3NO$ and a soluble copper salt. The counterelectrode 24 may be either an ideal polarizable electrode or a reference electrode based upon an equilibrium involving copper. In the latter case, the magnitude of the applied potential between a copper-based reference electrode and the cuprate crystal is given by the Nernst equation. As with the embodiment of FIG. 1, the cell 20 of FIG. 2 is used to set the chemical potential of copper in the superconducting electrode 22 so as to establish, stabilize, induce, or modulate superconductivity.

In both embodiments discussed above, that is, the anodically polarized superconductor of the embodiment of FIG. 1 and the cathodically polarized superconductor of the embodiment of FIG. 2, one varies the chemistry within the superconductor by changing the electrical potential of that superconductor with respect to a counterelectrode. In both embodiments the superconductor and the counterelectrode are in contact with the same electrolyte. As long as the potential is applied, the properties of the superconductor are controlled; that is to say, active intervention by electrochemical means changes the behavior of the material, while the material is in service. As mentioned above, whereas prior methods could change oxygen potential only during processing at higher temperatures, the present invention controls the electrochemistry of the system at the service temperature and therefore actively stabilizes or modulates superconducting properties such as the critical temperature. As will become clear hereinbelow, the ability to modulate a superconducting property may be utilized in a device such as a tunable infrared detector in which the energy gap of one electrode in a Josephson junction is controlled electrochemically, or in a transistor or switch based on an electrochemically induced transition from the superconducting to the normal state, or in any Josephson device, as the effect can be electrochemically modulated, e.g, mixers, detectors, and modulators.

FIG. 1 will also serve to illustrate an embodiment of the invention in which the superconducting material is a refractory metal nitride such as niobium nitride. In this case, the superconductor electrode 12 is niobium nitride and the electrolyte 16 is a nitrogen bearing electrolyte such as liquid cyanogen, $(CN)_2$.

Figure 3:
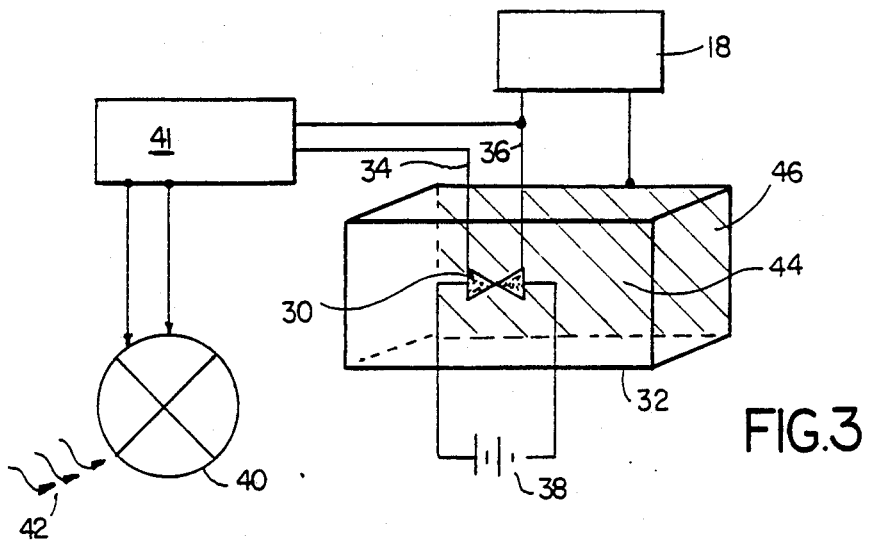
FIG. 3 is a perspective illustration of an infrared radiation detector employing the invention.
Figure 4:
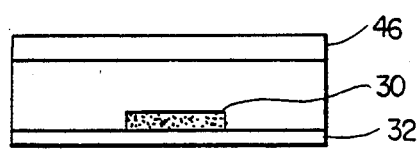
FIG. 4 is a top view of the embodiment in FIG. 3.

An embodiment of the invention serving as an infrared radiation detector is shown in FIG. 3. and FIG. 4. A Josephson junction device 30 is deposited on the inside of an infrared radiation detector window 32. The window 32 would be part of a suitable cavity (not shown). Leads 34 and 36 are connected across the Josephson junction 30. A voltage source 38 applies a voltage across the junction. The light chopper 40 and phase sensitive detector 41 serve to detect changes in the Josephson current through the junction 30. As will be appreciated by those skilled in the art, infrared radiation 42 impinging on the junction 30 will modulate the amplitude of the Josephson current that flows at a particular voltage bias enabling detection of the infrared radiation 42. A fuller discussion of superconducting infrared detectors and other devices is found in "Proceedings of the Workshop on Naval Applications of Superconductivity", ed. by J. E. Cox and E. A. Edelsack, NRL Report 7302, Naval Research Laboratory, Washington, DC. July 1, 1971. page 103. The teachings of this Naval Research Laboratory report are incorporated herein by reference. According to the present invention, the Josephson junction 30 is a thin film superconducting compound material such as a ceramic oxide. The side of the window 32 including the junction 30 is immersed in an electrolyte 44 and a potential is established between the superconducting junction 30 and a counterelectrode 46 by a potentiostat 18. The superconducting Josephson junction 30 is polarized with respect to the counterelectrode 46 in order to set the energy gap and thus the sensitivity to infrared radiation of the superconducting thin film Josephson junction 30. The aforementioned Naval Research Laboratory article teaches that there is a limit to the spectral range of detectable radiation. The present invention alters that limit in that it allows one to set the energy gap and, in this way, determine the response to incident radiation.

Figure 5:
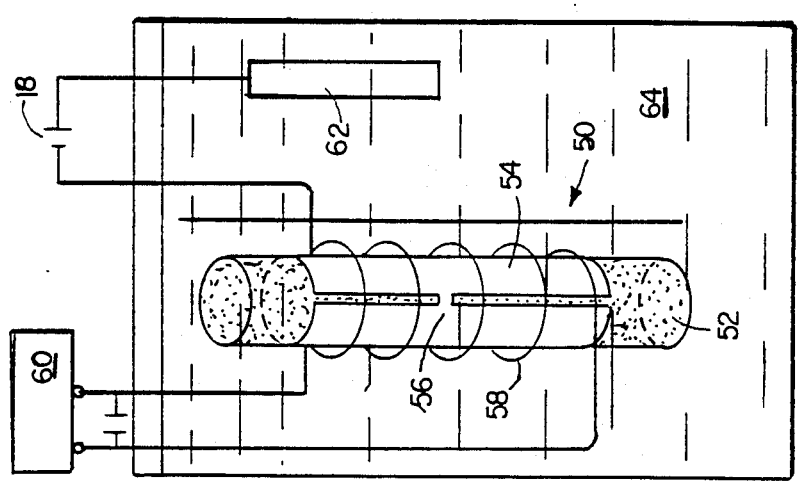
FIG. 5 is a schematic illustration of a magnetic field sensor embodying the principles of the invention.

Yet another application of the present invention is a device for measuring magnetic fields as shown in FIG. 5. (Superconducting magnetometers are described in more detail in an article in the Naval Research Laboratory report cited above beginning at page 127.) A magnetometer 50 according to the instant invention includes a dielectric cylinder 52 on which is deposited a thin superconducting film 54 such as yttrium barium cuprate. The film 54 includes a weak link section 56. A coil 58 is connected to circuitry 60 for driving the magnetometer 50 and sensing magnetic fields. The magnetometer 50 along with a counterelectrode 62 is immersed in an electrolyte 64 as discussed above in conjunction with FIGS. 1 and 2. The thin superconducting film 54 is polarized with respect to the counterelectrode 62 by, for example, a potentiostat 18. Through appropriate polarization one is able to after the conditions under which the superconducting film 54 is superconducting. That is, one can alter the temperature range of operation and also the response to magnetic fields.

Figure 6:
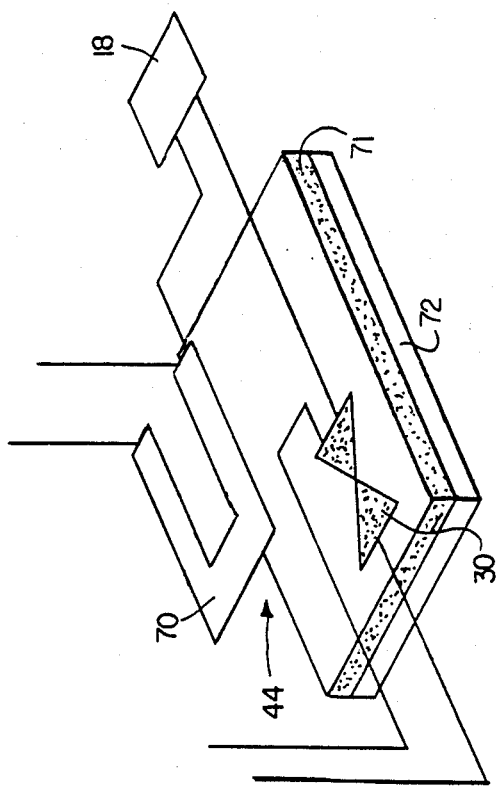
FIG. 6 is a perspective illustration of an electronic circuit element employing the present invention.
Figure 7:
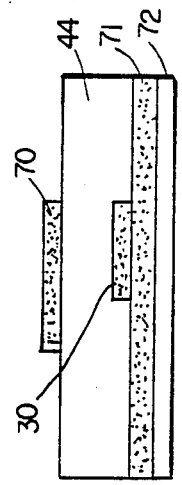
FIG. 7 is a front view of the embodiment of FIG. 6.

FIGS. 6 and 7 illustrate the application of the present invention to a basic electronic circuit device, the Josephson Cryotron, which can be used for the storage of information, and also the processing of information in computers. Basic teaching regarding such devices may be found, e.g. in the early article by Juri Matisoo, "Superconductive Computer Devices," on pp. 607–624 of "the Science and Technology of Superconductivity" (Vol. 2) edited by W. D. Gregory, W. N. Matthews and E. A. Edelsack (Plenum Press, London, 1973) In this embodiment the control layer 70 is used both to bias the electrolytic cell and produce, if necessary, magnetic fields for Josephson switching. Modulation is made possible by (a) bias and (b) control current, permitting triode or parametric operation of this device, greatly expanding applications. The operation of the "conventional" cryotron is described in the above-mentioned literature. In essence, a current through the control layer is used to switch the Josephson Junction in and out of the superconducting state, thereby controlling the junction current with a short switching time. In this embodiment the switching may also be achieved by the bias across the cell. This provides power gain and current gain, which is not attainable in the "conventional" cryotron. Additionally, the sensitivity to control current in the control layer may be varied by varying the cell bias. This device may be used anywhere a transistor is used and may be used to provide higher speed and efficiency.

Figure 8:
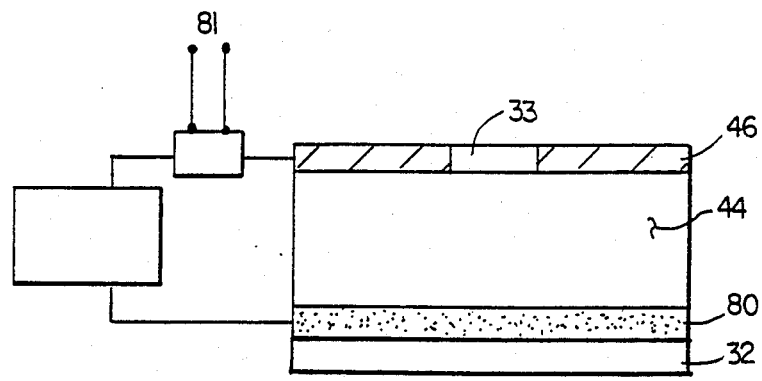
FIG. 8 is a schematic illustration of an optical device embodying the principles of the invention.
Figure 9:
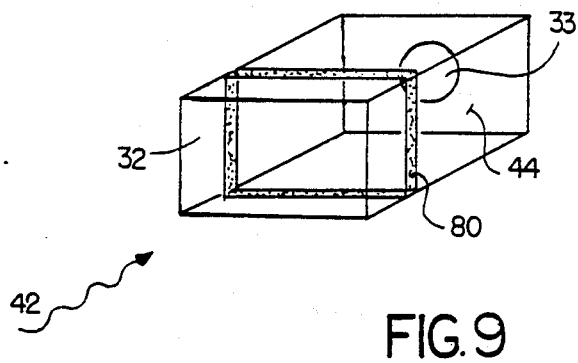
FIG. 9 is a front view of the embodiment of FIG. 8 is a schematic illustration of a magnetic field anomaly detector.

An optical device is another application of the claimed invention which is shown in FIGS. 8 and 9. The superconducting layer 80 is affixed to a transparent window 32 which is exposed to the incident radiation 42. The panel opposing the superconducting layer serves a the counter electrode 46, and provides a windowed opening 33 through which radiation 42 may pass. The voltage potential of the counter electrode relative to the superconducting layer is controlled by a potentiostat 18 and an external input signal 81 is further provided. During operation the transparency of the superconducting layer 80 is determined by the sum of the voltages from the potentiostat 18 and the input signal 81 together with the wavelength of incident radiation 42. Thus by appropriate selection of the input signal 81, the transparency of the superconductor 80 can be switched. Because absorption goes through a transition as a function of voltage which may not be abrupt, the operation mode may be on/off or gradual depending on how fast the bias voltage is changed. Thus, variable intensity operation is possible. Furthermore, reflectance will also change as a function of bias and the superconducting state will reflect lower frequencies better than the normal state. Therefore, switching of reflectivity is also possible.

The foregoing device embodiments of the present invention are entirely exemplary. It is recognized that those skilled in the art will appreciate that the active electrochemical intervention disclosed herein will have application beyond the specific devices discussed above. The active electrochemical intervention techniques of the present invention will have wide application and it is intended that all such applications fall within the scope of the appended claims. It is also recognized that modifications and variations of the present invention will occur to those skilled in the art and it is intended that all such modifications and variations be also included within the scope of the appended claims. It is further recognized that additional properties of the superconducting materials may be altered by the active electrochemical intervention techniques disclosed herein. For example, magnetic properties, optical properties, and mechanical properties may be controlled and altered by these techniques.

What is claimed is:

1. Electrochemical cell comprising:
a superconducting compound;
a counterelectrode;
an electrolyte in contact with the superconducting compound and the counterelectrode; and
circuitry for applying a desired potential between the superconducting compound and the counterelectrode, whereby a superconducting property of the superconducting compound is controlled or maintained by the applied potential.

2. The electrochemical cell of claim 1 wherein the superconducting property is critical temperature.

3. The electrochemical cell of claim 1 wherein the superconducting property is the energy gap for superconductivity.

4. The electrochemical cell of claim 1 wherein the superconducting compound is an oxide.

5. The electrochemical cell of claim 4 wherein the oxide is a cuprate.

6. The electrochemical cell of claim 1 wherein the superconducting compound is a refractory metal nitride.

7. The electrochemical cell of claim 6 wherein the refractory metal nitride is niobium nitride.

8. The electrochemical cell of claim 1 wherein the superconducting compound is yttrium barium cuprate.

9. The electrochemical cell of claim 1 which is operated at the cryogenic temperatures.

10. The electrochemical cell of claim 1 wherein the superconducting compound is the anode and the electrolyte is an oxygen-bearing medium in which the dominant mode of electrical conductivity is ionic.

11. The electrochemical cell of claim 4 wherein the superconducting oxide material is the cathode and the electrolyte is a copper bearing medium.

12. The electrochemical cell of claim 1 wherein the counterelectrode is an ideal polarizable electrode.

13. The electrochemical cell of claim 1 wherein the counterelectrode is a reference electrode based on an equilibrium with oxygen.

14. The electrochemical cell of claim 4 wherein the electrolyte comprises $O_3$.

15. The electrochemical cell of claim 5 wherein the electrolyte comprises $CF_3NO$ and a copper salt.

16. The electrochemical cell of claim 6 wherein the electrolyte comprises $(CN)_2$.

17. Electrochemical cell comprising:
a superconducting cuprate material;
a counterelectrode;
an oxygen bearing electrolyte in contact with the cuprate material and the counterelectrode; and
circuitry for polarizing the cuprate material positively with respect to the counterelectrode, whereby the transition temperature of the oxide material is controlled or maintained by the applied potential.

18. Electrochemical cell comprising:
a superconducting cuprate material;
a counterelectrode;
a copper bearing electrolyte in contact with the oxide material and the counterelectrode; and
circuitry for polarizing the superconducting cuprate material cathodically with respect to the counterelectrode, whereby the transition temperature of the cuprate material is controlled or maintained by the applied potential.

19. Method for controlling or maintaining the transition temperature of a superconducting compound comprising applying a selected potential between the superconducting compound and a counterelectrode, both superconducting compound and counterelectrode contacting an electrolyte.

20. Method for controlling the effective valency of copper in a superconducting cuprate comprising:
applying a selected potential between the cuprate and a counterelectrode, both the cuprate and the counterelectrode contacting an electrolyte.

21. Method for controlling oxygen potential in a superconducting cuprate comprising:
applying a selected potential between the cuprate and a counterelectrode, both the cuprate and the counterelectrode contacting an oxygen-bearing electrolyte.

22. An infrared radiation detector comprising:
a superconducting compound Josephson junction responsive to infrared radiation;
a counterelectrode;

an electrolyte in contact with the Josephson junction and the counterelectrode; and circuitry for applying a desired potential between the Josephson junction and the counterelectrode;

whereby the energy gap of the superconducting Josephson junction is set to determine the response to incident radiation.

23. Magnetic field detector comprising:

a superconducting compound film supported on a substrate, the film including a weak link;

a coil surrounding the superconducting film and connected to external electronics;

a counterelectrode;

an electrolyte in contact with the superconductive film and the counterelectrode; and circuitry for applying a desired potential between the superconducting film and the counterelectrode whereby the response to magnetic fields is controlled by the applied potential.

24. A superconducting electronic device (called herein "electrolytic Josephson Cryotron") comprising:

a Josephson junction of superconducting compound a control layer and countelectrode (combined or separate)

an electrolyte contacting both the Josephson Junction and the counterelectrode;

an insulated ground plane beneath the Josephson Junction; and circuitry for applying a desired potential between the superconducting material and the counterelectrode.

25. A superconducting optical device comprising:

a superconducting layer supported on a window transparent to radiation;

a counterelectrode positioned opposite said superconducting layer with a windowed opening to allow passage of said radiation;

an electrolyte in contact with the superconducting film and counter electrode and;

circuitry for applying a desired potential between the superconducting film and counter electrode whereby the transparency of the said film may be varied.

26. The device of claim 24, wherein:

an input voltage is provided to allow external variation of the sum potential difference of the superconducting film and counter electrode.

27. The device of claim 24 wherein:

a detector is provided to observe incident radiation modulated by the varied transparency of the superconducting film.

* * * * *

UNITED STATES PATENT AND TRADEMARK OFFICE
CERTIFICATE OF CORRECTION

PATENT NO. : 4,911,800

DATED : March 27, 1990

INVENTOR(S) : Donald R. Sadoway, et al

It is certified that error appears in the above-identified patent and that said Letters Patent is hereby corrected as shown below:

```
Column 6, line  6:  change "DC." to -- DC, --.
          line  6:  change "1971." to -- 1971, --.
          line 40:  change "after" to -- alter --.
          line 53:  after "1973)" insert -- . --.
```

Signed and Sealed this

Second Day of July, 1991

Attest:

HARRY F. MANBECK, JR.

*Attesting Officer*  *Commissioner of Patents and Trademarks*